(12) United States Patent
Kao et al.

(10) Patent No.: US 7,335,982 B2
(45) Date of Patent: Feb. 26, 2008

(54) CHIP PACKAGE STRUCTURE AND CHIP PACKAGING PROCESS

(75) Inventors: Chin-Li Kao, Penghu County (TW); Yi-Shao Lai, Taipei County (TW); Jeng-Da Wu, Kaohsiung (TW); Tong-Hong Wang, Selangor D. E. (MY)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

(21) Appl. No.: 10/907,340

(22) Filed: Mar. 30, 2005

(65) Prior Publication Data
US 2005/0224956 A1    Oct. 13, 2005

(30) Foreign Application Priority Data
Apr. 2, 2004    (TW)    .............................. 93109186 A

(51) Int. Cl.
*H01L 23/10*    (2006.01)

(52) U.S. Cl. ........................ 257/706; 257/796; 257/788

(58) Field of Classification Search ................ 257/706, 257/719
See application file for complete search history.

(56) References Cited

U.S. PATENT DOCUMENTS

| | | | |
|---|---|---|---|
| 5,835,355 A * | 11/1998 | Dordi | 361/760 |
| 6,084,308 A * | 7/2000 | Kelkar et al. | 257/777 |
| 6,818,980 B1* | 11/2004 | Pedron, Jr. | 257/706 |
| 6,819,565 B2* | 11/2004 | Kao et al. | 361/704 |
| 2002/0195721 A1* | 12/2002 | Lee et al. | 257/780 |
| 2004/0217472 A1* | 11/2004 | Aisenbrey et al. | 257/734 |
| 2005/0012203 A1* | 1/2005 | Khan et al. | 257/707 |
| 2005/0051890 A1* | 3/2005 | Zhang et al. | 257/712 |
| 2005/0258537 A1* | 11/2005 | Huang et al. | 257/738 |

\* cited by examiner

*Primary Examiner*—Thao P. Le
(74) *Attorney, Agent, or Firm*—Jianq Chyun IP Office

(57) ABSTRACT

A chip packaging process is provided. First, a cavity is formed on a heat sink. A first encapsulant is formed on the bottom of the cavity. A circuit substrate is disposed over the heat sink. The circuit substrate has an opening that corresponds in position to the cavity. Thereafter, a chip is disposed on the first encapsulant and the chip is electrically connected to the circuit substrate. Finally, a compound is deposited over the first encapsulant and the chip to form a chip package. The chip package is warp resistant and the chip packaging process increases overall production yield.

13 Claims, 6 Drawing Sheets

CHIP PACKAGE STRUCTURE AND CHIP PACKAGING PROCESS

CROSS-REFERENCE TO RELATED APPLICATION

This application claims the priority benefit of Taiwan application serial no. 93109186, filed on Apr. 2, 2004.

BACKGROUND OF THE INVENTION

1. Field of the Invention

The present invention relates to a chip package structure and a chip packaging process. More particularly, the present invention relates to a warp-resistant chip package structure and chip packaging process for improving the yield of production.

2. Description of the Related Art

With the rapid progress in electronic technologies and semiconductor manufacturing in recent years, a lot of personalized and multifunctional electronic products flooded the market. Moreover, these electronic products are often miniaturized and downsized for portability. In the area of semiconductor production, the fabrication of integrated circuits (IC) can be roughly divided into three main stages: integrated circuit design, integrated circuit fabrication and integrated circuit packaging. In general, raw chips are produced after going through a series of steps including wafer production, circuit design, mask production and wafer dicing operation. Each piece of raw chip cut out from the wafer must be electrically connected to a substrate for external communication through the bonding pads thereon. Moreover, each raw chip must be encapsulated by an encapsulant to form an IC package that prevents moisture, heat or electrical noise from interfering with its function and a medium for connecting with an external circuit such as a printed circuit board (PCB) or other packaging substrate.

Due to the rapid advance in IC production technologies, the operating speed of each chip continues to increase so that various types of digital data processing and computation are increasingly efficient. However, as the level of integration of circuits within each chip increases exponentially, the amount of heat generated per unit area in normal operation also increases accordingly. At maximum operating speed, the need to dissipate the heat away from the chip fast enough is critical. Conventionally, a metallic heat sink with high heat-dissipating capacity is disposed on a chip package to absorb heat and conduct the heat away to the surrounding atmosphere.

FIG. 1 is a schematic cross-sectional view showing the structure of a conventional chip package. As shown in FIG. 1, the chip package structure 100 comprises a chip 110, a circuit substrate 120, a heat sink 130 and an encapsulant 140. The circuit substrate 120 having an opening 120a therein is disposed on the heat sink 130. The back surface 110b of the chip 110 is mounted to the heat sink 130 within the opening 120a of the circuit substrate 120 by adhesive glue (not shown). The active surface 110a of the chip 110 has a plurality of bonding pads 112 thereon. The circuit substrate 120 has a plurality of first bonding pads 122a and a plurality of second bonding pads 122b surrounding the first bonding pads 122a. The chip 110 and the circuit board 120 are electrically connected through a wire-bonding process. Typically, each bonding pad 112 on the chip 110 is electrically connected to a corresponding first bonding pad 122a on the circuit substrate 120 through a conductive wire 150.

As shown in FIG. 1, the encapsulant 140 fills up the opening 120a entirely and encapsulates the chip 110, the conductive wires 150 and the first bonding pads 122a on the circuit substrate 120. The encapsulant 140 prevents moisture, heat or electrical noise from affecting the chip 110 and protects the conductive wires 150 against mechanical damage. Furthermore, a plurality of conductive bumps 160 is formed on the second bonding pads 122b of the circuit substrate 120 to serve as a medium of contact for connecting the chip package 100 to external circuits.

To form the encapsulant in the aforementioned chip packaging process, a molding compound such as epoxy resin is heated to a semi-liquid form at a high temperature and injected into a mold. Thereafter, the molding compound is cooled to form a solidified encapsulant. However, the heat sink and the encapsulant have different coefficient of thermal expansion (CTE). Thus, a thermal stress of non-uniform magnitude is often generated inside the chip package somewhere between the heat sink and the encapsulant during the cooling process. Due to the thermal stress, the chip package is more likely to warp or crack. The warping or cracking of the chip package frequently leads to irreversible damage to either the chip or the conductive wires. Therefore, the yield of the chip packaging process can not be enhanced effectively.

SUMMARY OF THE INVENTION

Accordingly, the present invention is directed to provide a chip package structure, wherein the thermal stress around a chip is uniform. Thus, warping and cracking of the chip package is significantly reduced and the reliability of the connection between the chip and conductive wires inside the chip package is maintained.

The prevent invention is further directed to provide a chip packaging process that includes the step of encapsulating a chip with an identical material so that the effect of thermal stress on the chip package is substantially reduced. Consequently, there is a significant improvement in overall product yield of the chip package.

According to an embodiment of the present invention, a chip package structure is provided. The chip package comprises a heat sink, a circuit substrate, a chip, a first encapsulant, a second encapsulant and a plurality of conductive bumps. The heat sink has a cavity and the circuit substrate is disposed on the heat sink. The circuit substrate has a top surface and an opening that corresponds in position to the cavity. The chip is disposed at the bottom of the cavity and is electrically connected to the circuit substrate. The first encapsulant is disposed between the heat sink and the chip. Furthermore, the first encapsulant is in contact with the sidewall of the cavity. The second encapsulant is disposed over the first encapsulant to cover the chip and a portion of the circuit substrate. The conductive bumps are disposed on the top surface of the circuit substrate outside the second encapsulant to serve as a medium of contact for connecting the chip package with external circuits.

In an embodiment of the present invention, the first encapsulant has a height small than, equal to or greater than the depth of the cavity. The chip package structure may further comprise a heat-conductive interlayer such as a metallic layer or a patterned metallic layer. The heat-conductive interlayer is disposed between the chip and the first encapsulant and extends between the circuit substrate and the heat sink to conduct heat directly away to the heat sink. The chip and the circuit substrate are electrically connected through a plurality of conductive wires bonded to the circuit substrate and the chip in a wire-bonding process. The second encapsulant further encapsulates the conductive wires to protect the conductive wires against possible damage resulting from external forces.

In one embodiment of the present invention, the first encapsulant and the second encapsulant are fabricated using an identical material such as epoxy resin. In addition, the conductive bumps are distributed around the second encapsulant.

The present invention further provides an alternative chip package structure. The chip package comprises a heat sink, a circuit substrate, a chip, an encapsulant and a plurality of conductive bumps. The heat sink has a cavity and the circuit board is disposed on the heat sink. The circuit board has a top surface and an opening that corresponds in position to the cavity. The chip is disposed in the cavity. The chip and the circuit substrate are electrically connected through a plurality of conductive wires. The encapsulant encapsulates the chip and the conductive wires and is in contact with the sidewalls and bottom surface of the cavity. The conductive bumps are disposed on the top surface of the circuit substrate.

The present invention further provides a chip packaging process comprising the following steps. First, a cavity is formed on a heat sink and then a first encapsulant is formed at the bottom of the cavity. A circuit substrate is disposed on the heat sink. The circuit substrate has an opening that corresponds in position to the cavity. A chip is disposed on the first encapsulant. The chip and the circuit substrate are electrically connected. Thereafter, a second encapsulant is formed over the first encapsulant to encapsulate the chip and a portion of the circuit substrate. Ultimately, a plurality of conductive bumps are formed on the circuit substrate.

In one embodiment of the present invention, the chip packaging process may include forming a heat-conductive interlayer over the first encapsulant and the heat sink before disposing the circuit substrate over the heat sink. Thus, a more efficient heat conductive path is created. In addition, the heat-conductive interlayer can be a metallic layer or a patterned metallic layer. Moreover, the chip and the circuit substrate are electrically connected through conductive wires formed in a wire-bonding process.

In brief, the chip package structure and the chip packaging process is characterized by disposing a first encapsulant between the chip and the heat sink to increase the gap formed between the chip and the heat sink. The first encapsulant and the second encapsulant are fabricated from an identical material so that they have an identical coefficient of thermal expansion. Hence, the degree of warping in the chip package is minimized when the molding compound for forming the second encapsulant is cooled. Furthermore, since the chip is entirely encapsulated by the first encapsulant and the second encapsulant, a uniform thermal stress is generated around the chip. As a result, reliability of the connection between the chip and the conductive wires is maintained and the chip packaging process with a higher overall yield is provided.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
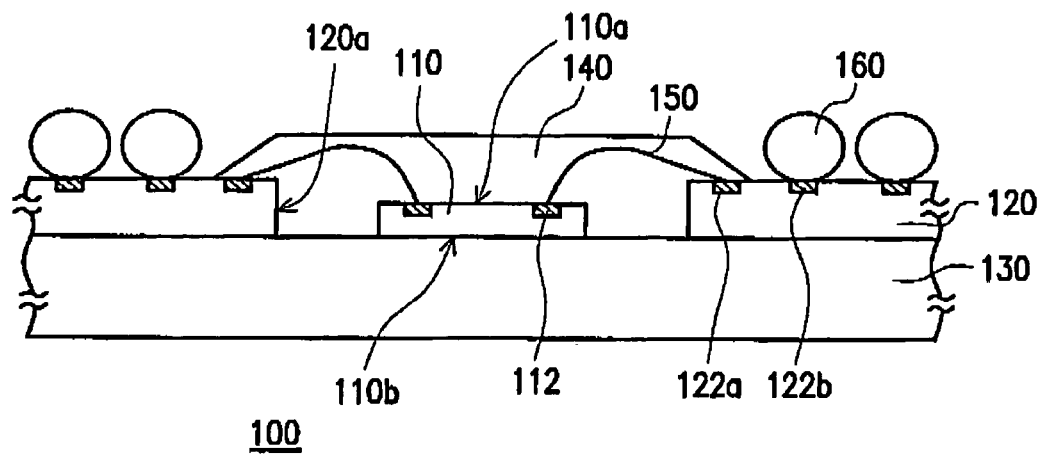
FIG. 1 is a schematic cross-sectional view showing the structure of a conventional chip package.

Reference will now be made in detail to the present embodiments of the invention, examples of which are illustrated in the accompanying drawings. Wherever possible, the same reference numbers are used in the drawings and the description to refer to the same or like parts.

Figure 2A:
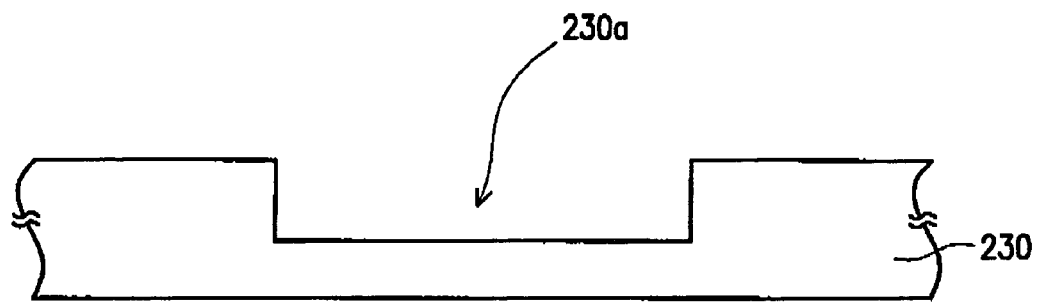
FIGS. 2A through 2G are schematic cross-sectional view showing the steps in a chip packaging process for producing a chip package according to a first embodiment of the present invention.
Figure 2B:
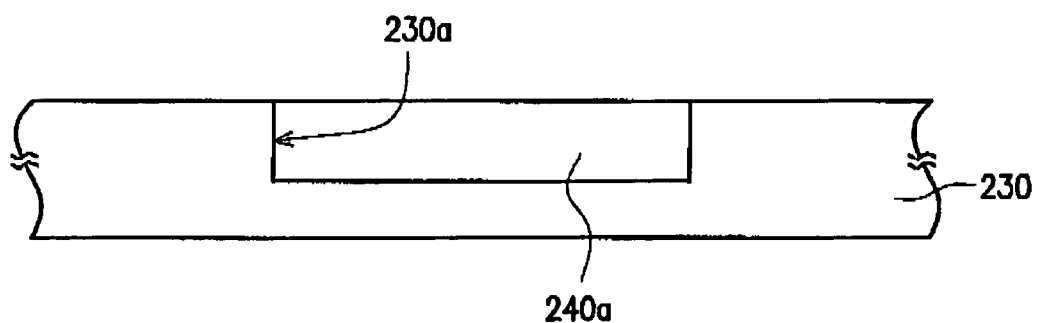
Figure 2C:
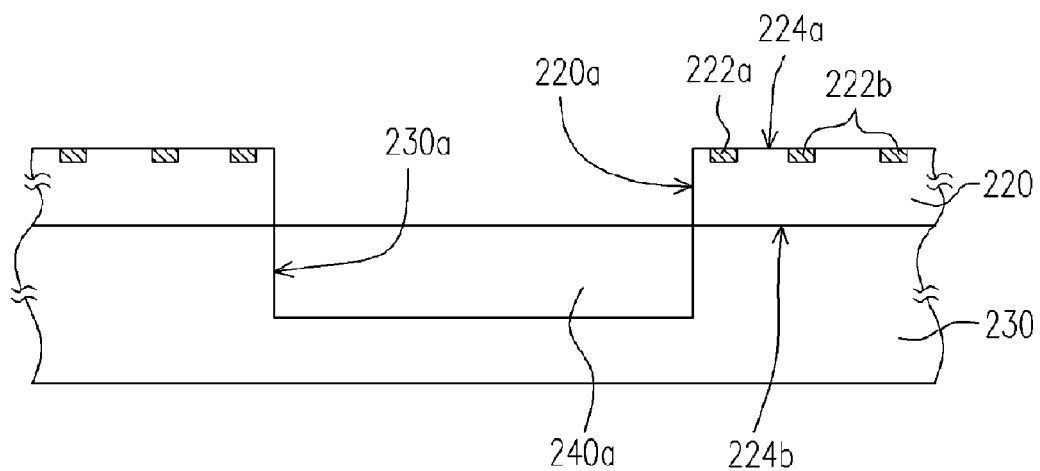

FIGS. 2A through 2G are schematic cross-sectional view showing the steps in a chip packaging process for producing a chip package according to a first embodiment of the present invention. First, as shown in FIG. 2A, a cavity 230a is formed on a heat sink 230. The cavity 230a is formed, for example, by performing mechanical drilling, laser drilling or etching. As shown in FIG. 2B, a first encapsulant 240a is formed on the bottom of the cavity 230a by applying a material such as epoxy resin. Thereafter, as shown in FIG. 2C, a circuit substrate 220 is disposed on the heat sink 230. The circuit substrate 220 has an opening 220a that corresponds in position to the cavity 230a. Furthermore, the circuit substrate 220 has a top surface 224a having a plurality of first bonding pads 222a and a plurality of second bonding pads 222b thereon. The second bonding pads 222b are located around the first bonding pads 222a. The bottom surface 224b of the circuit substrate 220 is attached to the heat sink 230 by adhesive glue (not shown), for example.

Figure 2D:
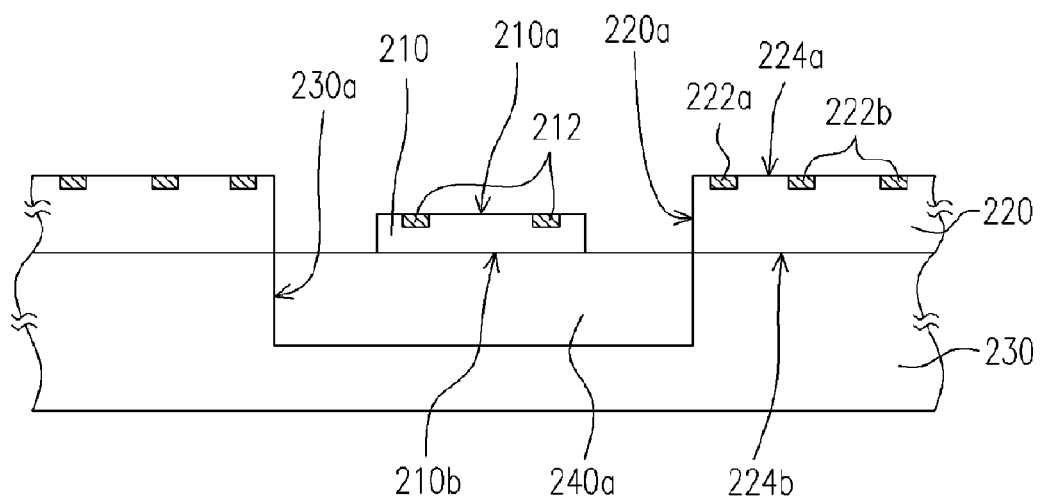
Figure 2E:
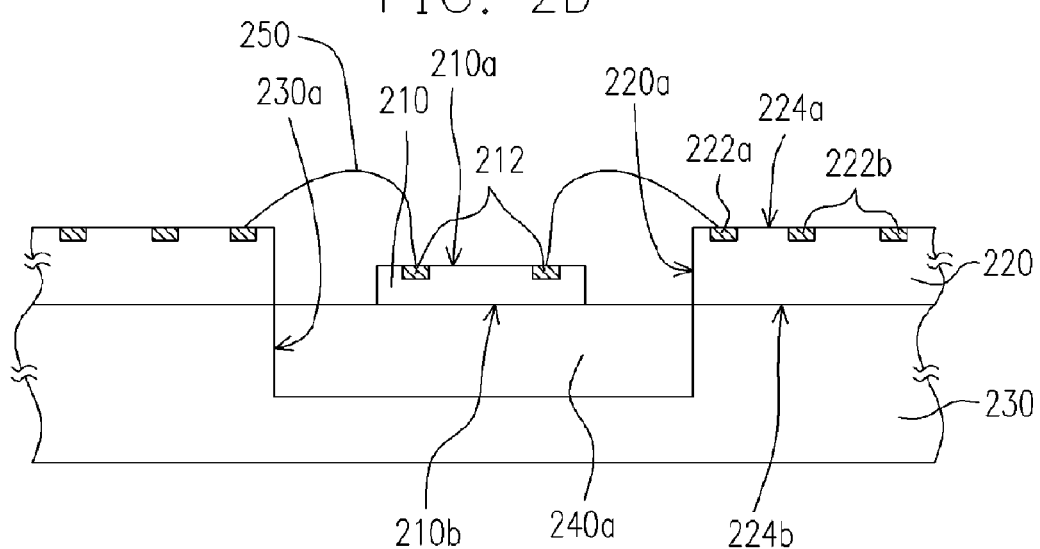
Figure 2F:
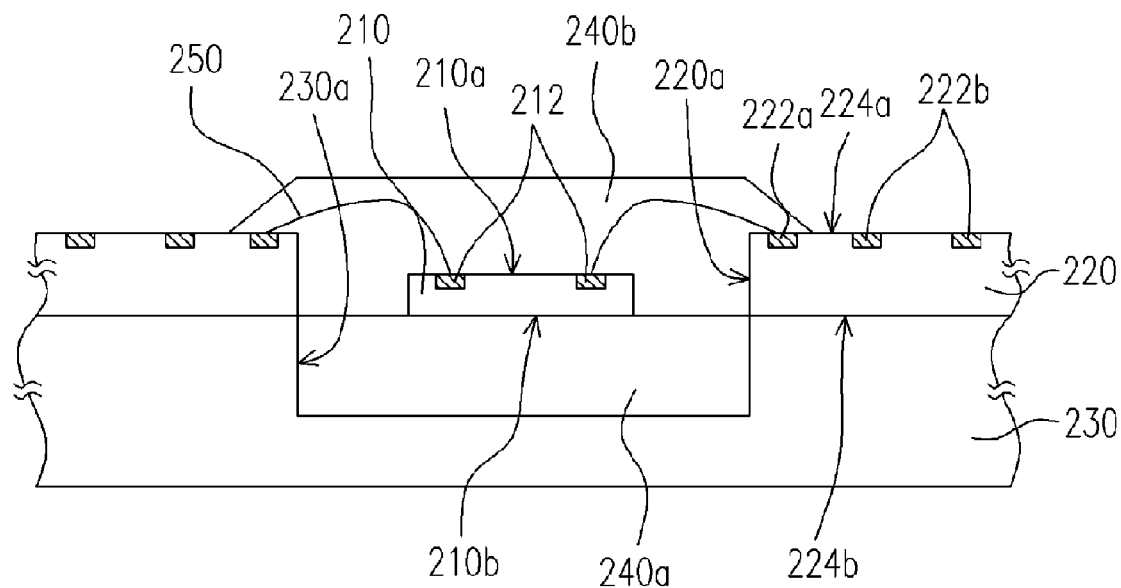

As shown in FIG. 2D, a chip 210 is disposed on the first encapsulant 240a. The chip 210 has an active surface 210a and a back surface 210b. The active surface 210a has a plurality of bonding pads 212 thereon. As shown in FIG. 2E, a wire-bonding process is performed to electrically connect the bonding pads 212 on the chip 210 with the first bonding pads 222a on the circuit substrate 220 by a plurality of conductive wires 250. As shown in FIG. 2F, a second encapsulant 240b is formed over the first encapsulant 240a. The second encapsulant 240b is fabricated from a material identical to the first encapsulant 240a (such as epoxy resin). The second encapsulant 240b encapsulates the first bonding pads 222a, the conductive lines 250 and the chip 210

Figure 2G:
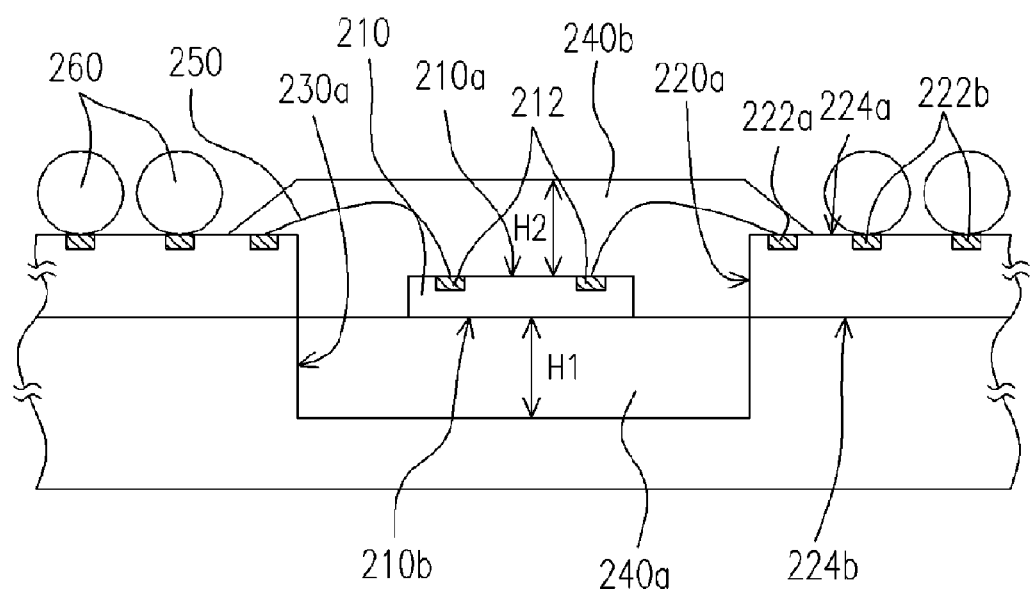

(including the bonding pads 212). Finally, as shown in FIG. 2G, a plurality of conductive bumps 260 are formed on the second bonding pads 222b of the circuit substrate 220. After the conductive bumps 260 are formed, a complete chip package 200 is provided. The conductive bumps 260 has a height greater than the height of the second encapsulant 240b above the top surface 224a of the circuit substrate 220 to facilitate electrically connecting the chip package 200 through the conductive bumps 260 with an external device.

In the present embodiment, the chip package structure and the chip packaging process use identical material (including the second encapsulant 240b and the first encapsulant 240a) to encapsulate the chip. The material around the chip serves as a buffer to reduce the degree of warping in the chip package, maintains a fixed relationship between the chip and the conductive wires and increases product yield of the chip packaging process. However, the chip packaging process of the present invention further permits the disposition of the circuit substrate 220 over the heat sink 230 before forming the first encapsulant 240a inside the cavity 230a for supporting the chip 210. Since the process has been explained with reference to FIGS. 2B and 2C, detailed description is omitted.

In addition, both the first encapsulant 240a and the second encapsulant 240b may be fabricated from an identical material as shown in FIG. 2G. Furthermore, since the chip 210 may be located close to the center of the cavity 230a when the height H1 of the first encapsulant 240a and the height H2 of the second encapsulant 210b are near, a uniform stress around the chip 210 is obtained. In other words, the chip 210 is more resistance to warping as a result of thermal stresses. However, the height H1 of the first encapsulant 240a need not be close to the heights H2 of the second encapsulant 230b as shown in FIG. 2G. In practice, different types of molding compounds can be used to match the particular type of design to reduce production cost.

Figure 3:
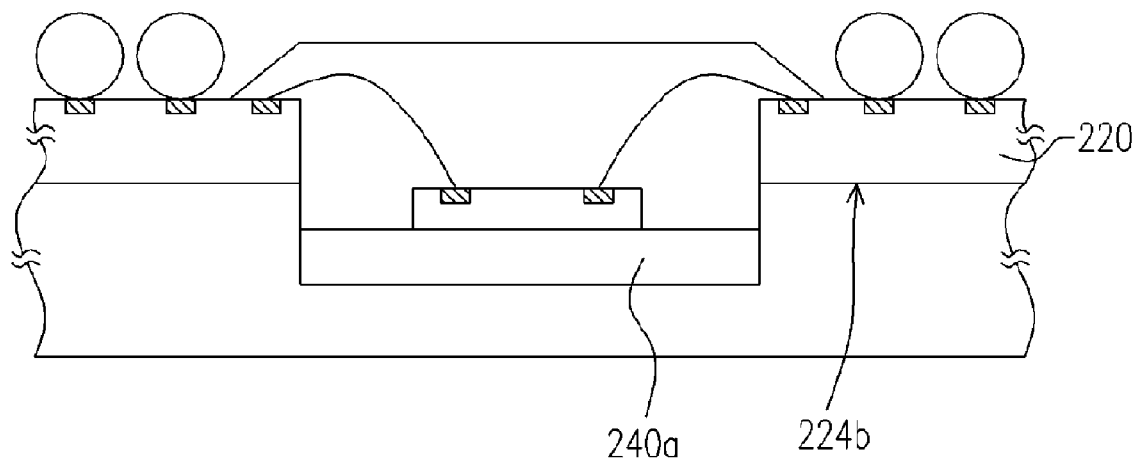
FIG. 3 is a schematic cross-sectional view of a second chip package structure fabricated using the chip packaging process according to the first embodiment of the present invention.
Figure 4:
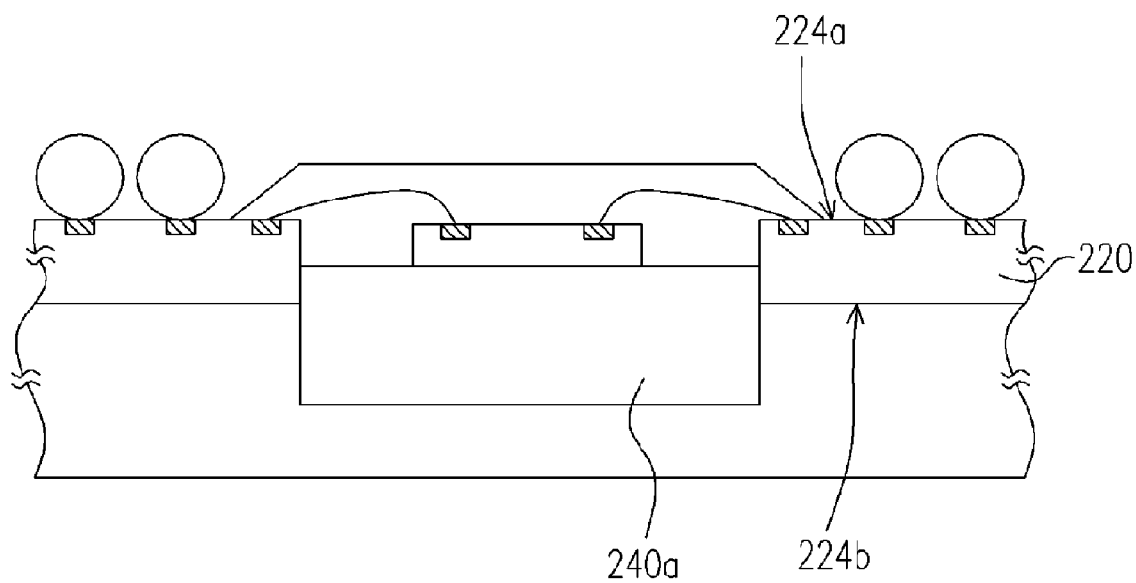
FIG. 4 is a schematic cross-sectional view of a third chip package structure fabricated using the chip packaging process according to the first embodiment of the present invention.

FIG. 3 is a schematic cross-sectional view of another chip package structure fabricated using the chip packaging process according to the first embodiment of the present invention. As shown in FIG. 3, the top surface of the first encapsulant 240a is at a level lower than the bottom surface 224b of the circuit substrate 220. FIG. 4 is a schematic cross-sectional view of still another chip package structure fabricated using the chip packaging process according to the first embodiment of the present invention. As shown in FIG. 4, the circuit substrate 220 is formed over the heat sink before forming the first encapsulant 240a so that the top surface of the first encapsulant 240a can reach a height between the top surface 224a and the bottom surface 224b of the circuit substrate 220.

Figure 5:
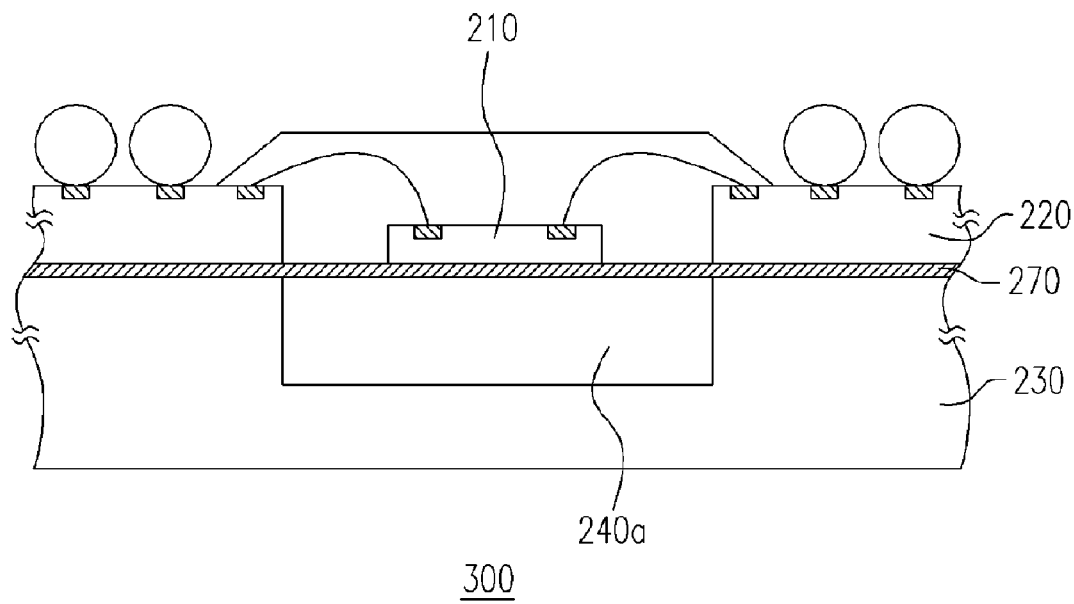
FIG. 5 is a schematic cross-sectional view of a first chip package structure according to a second embodiment of the present invention.

Using the first type of chip package structure and its corresponding chip packaging process as a base, a chip package structure and chip packaging process having a higher heat dissipation can be produced. FIG. 5 is a schematic cross-sectional view of a first chip package structure according to a second embodiment of the present invention. As shown in FIGS. 2G and 5, the chip package structure 300 in FIG. 5 has an additional heat-conductive interlayer 270 disposed between the chip 210 and the first encapsulant 240a. The heat-conductive interlayer 270 is fabricated by silver, copper or some other heat conductive metallic materials. Furthermore, the heat-dissipation layer 270 may extend between the circuit substrate 220 and the heat sink 230 so that heat generated by the chip 210 can be directly transferred to the heat sink 230 via the heat-conductive interlayer 270.

Figure 6:
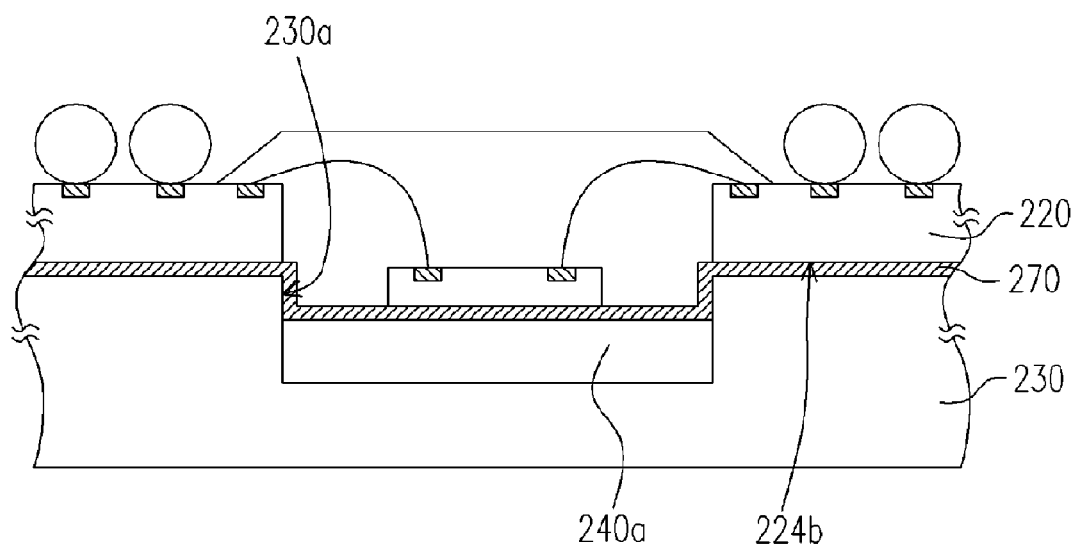
FIG. 6 is a schematic cross-sectional view of a second chip package structure according to the second embodiment of the present invention.

The chip packaging process for forming the chip package structure 300 in FIG. 5 includes performing an electroplating to form the heat-conductive interlayer 270 after forming the first encapsulant 240a (as shown in FIG. 2B). The process may also include a patterning step to form a patterned heat-conductive interlayer 270. FIG. 6 is a schematic cross-sectional view of a second chip package structure according to the second embodiment of the present invention. As shown in FIG. 6, the top surface of the first encapsulant is at a level lower than the bottom surface 224b of the circuit substrate 220. The heat-conductive interlayer 270 is located on the top surface of the first encapsulant 240a, a portion of the sidewalls of the cavity 230a and between the heat sink 230 and the circuit substrate 220.

Figure 7A:
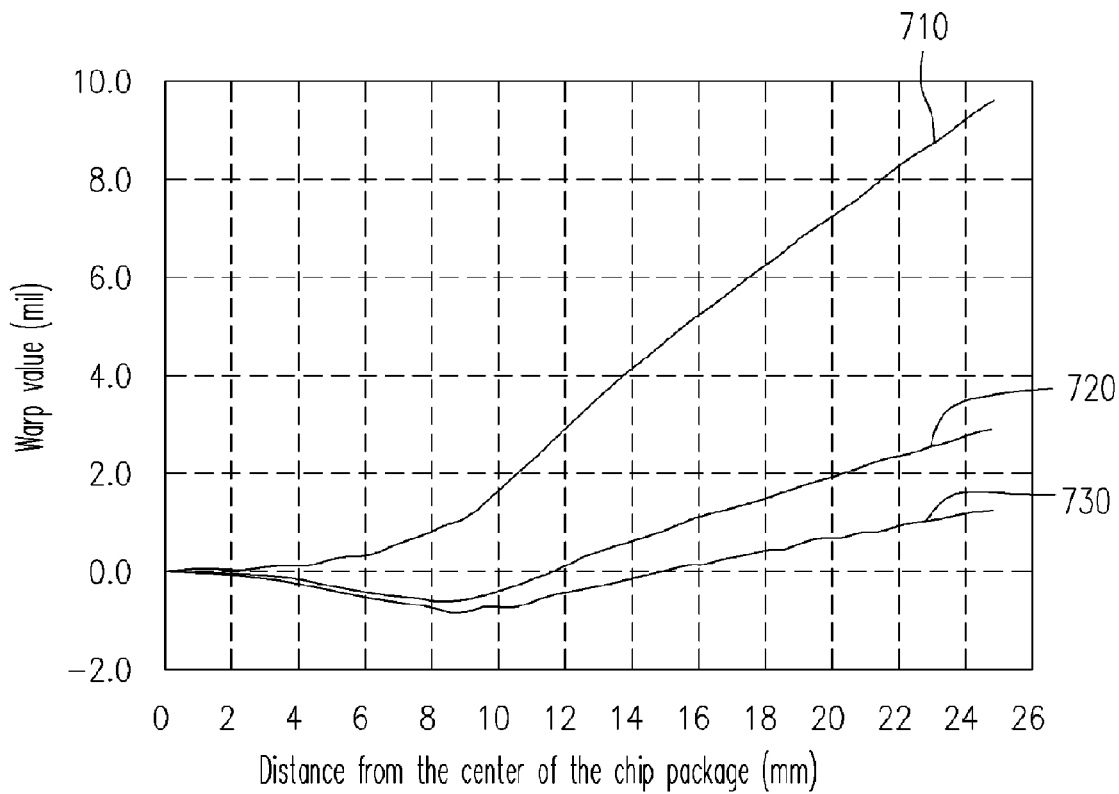
FIGS. 7A and 7B are graphs obtained from a simulation showing the degree of warping between the chip package of the present invention and the conventional chip package at different temperatures.
Figure 7B:
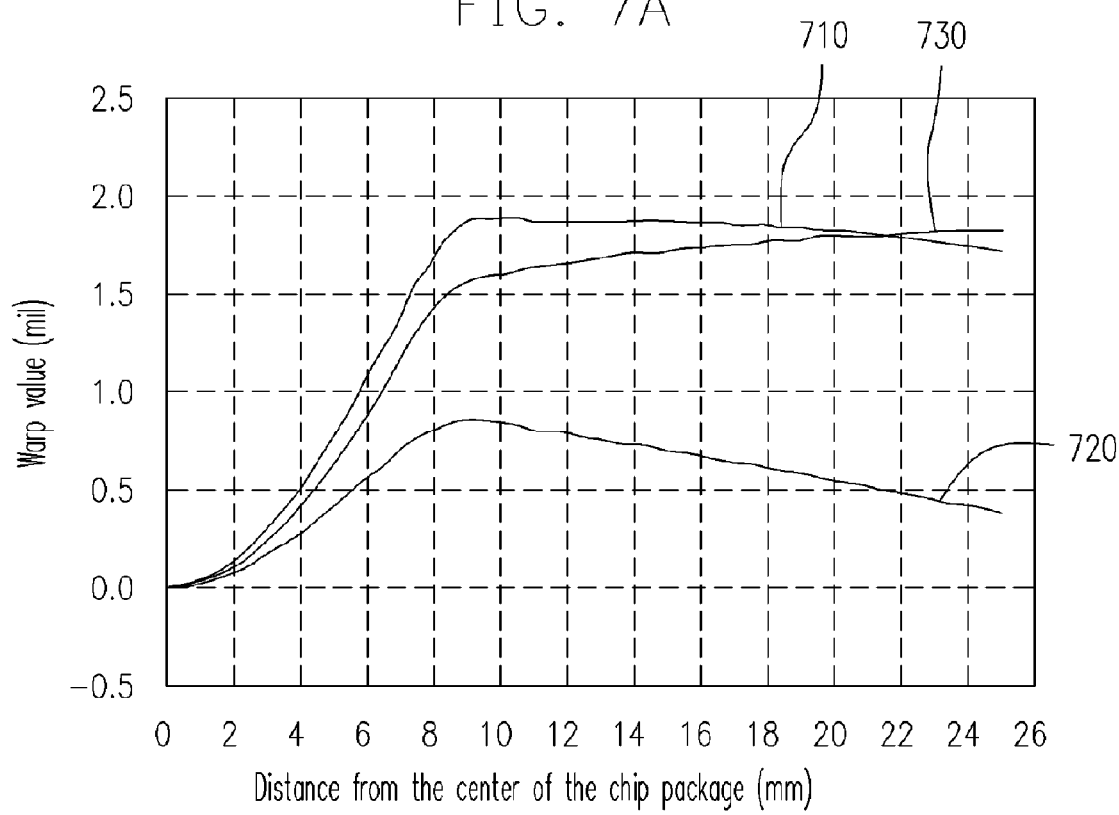

FIGS. 7A and 7B are graphs obtained from a simulation showing the degree of warping between the chip package of the present invention and the conventional chip package at different temperatures. The simulated temperature is −65° C. in FIG. 7A and the simulated temperature is 225° C. in FIG. 7B. In addition, the curve 710 represents the warping of the diagonal line in a conventional chip package. Similarly, the curve 720 represents the warping of the diagonal line in the chip package structure shown in FIG. 2G and the curve 730 represents the warping of the diagonal line in the chip package structure shown in FIG. 5. As shown in FIGS. 7A and 7B, there are substantial improvements in the degree of warping for the chip package structure fabricated according to the present invention.

In summary, the main idea behind the chip package structure and the chip packaging process is to form a cavity on a heat sink, depositing a material into the cavity to form a first encapsulant and disposing a chip over the first encapsulant. The first encapsulant serves to increase the gap formed between the chip and the heat sink. Thereafter, the encapsulating material is deposited to form a second encapsulant that encapsulates the chip. The first encapsulant and the second encapsulant are fabricated from an identical material such as epoxy resin so that they have an identical coefficient of thermal expansion. Hence, the degree of warping in the chip package is minimized when the second encapsulant is cooled. Furthermore, since the chip is entirely encapsulated by the first encapsulant and the second encapsulant, a uniform thermal stress is generated around the chip. As a result, the chip and the conductive wires are able to remain in a fixed location and provide the chip packaging process with a higher overall yield.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A chip package structure, comprising:
    a heat sink having a cavity;
    a circuit substrate having a top surface disposed on the heat sink, wherein the circuit substrate has an opening that corresponds in position to the cavity;
    a chip disposed at a bottom of the cavity, wherein the chip is electrically connected to the circuit substrate;
    a first encapsulant disposed between a bottom surface of the chip and the heat sink, wherein the first encapsulant is in contact with the sidewalls of the cavity;
    a second encapsulant disposed over the first encapsulant to encapsulate the chip and a portion of the circuit substrate; and a plurality of conductive bumps disposed on the top surface of the circuit substrate outside the second encapsulant.

2. The chip package structure of claim 1, wherein the first encapsulant has a height smaller than the depth of the cavity.

3. The chip package structure of claim 1, wherein the first encapsulant has a height equal to the depth of the cavity.

4. The chip package structure of claim 1, wherein the first encapsulant has a height greater than the depth of the cavity.

5. The chip package structure of claim 1, further comprising a heat-conductive interlayer, wherein the heat-conductive interlayer is disposed between the chip and the first encapsulant and extends between the circuit substrate and the heat sink.

6. The chip package structure of claim 5, wherein the heat-conductive interlayer is a metallic layer.

7. The chip package structure of claim 5, wherein the heat-conductive interlayer is a patterned metallic layer.

8. The chip package structure of claim 1, further comprising a plurality of conductive wires for electrically connecting the chip and the circuit substrate, wherein the second encapsulant further encapsulates the conductive wires.

9. The chip package structure of claim 1, wherein the first encapsulant and the second encapsulant are identical in material.

10. The chip package structure of claim 1, wherein a material of the first encapsulant comprises epoxy resin.

11. The chip package structure of claim 1, wherein the material of the second encapsulant comprises epoxy resin.

12. A chip package structure, comprising:
a heat sink having a cavity, wherein the cavity has a depth;
a circuit substrate disposed on the heat sink, wherein the circuit substrate has a top surface and an opening in a position that corresponds to the cavity;
a first encapsulant, disposed on the heat sink inside the cavity;
a chip disposed on the first encapsulant inside the cavity, wherein a thickness of the first encapsulant is at least one half of the depth of the cavity;
a plurality of conductive wires electrically connecting the chip and the circuit substrate;
a second encapsulant with the first encapsulant encapsulating the chip and the conductive wires, and at least the first encapsulant having contact with the bottom and the sidewalls of the cavity; and
a plurality of conductive bumps disposed on the top surface of the circuit substrate.

13. The chip package structure of claim 1, wherein the cavity has a depth and a thickness of the first encapsulant is at least one half of the depth of the cavity.

* * * * *